(12) United States Patent
Gee et al.

(10) Patent No.: US 6,359,578 B1
(45) Date of Patent: Mar. 19, 2002

(54) SYSTEM FOR EXTERNALLY REFERENCED RATIOMETRIC SIGNAL PROCESSING

(75) Inventors: Gregory Paul Gee, Waterford; Lawrence Dean Hazelton, Goodrich, both of MI (US)

(73) Assignee: Delphi Technologies, Troy, MI (US)

( * ) Notice: Subject to any disclaimer, the term of this patent is extended or adjusted under 35 U.S.C. 154(b) by 0 days.

(21) Appl. No.: 09/498,295

(22) Filed: Feb. 4, 2000

(51) Int. Cl.[7] .................................................. H03M 1/12
(52) U.S. Cl. .......................... 341/155; 341/118; 341/132
(58) Field of Search .................................. 341/155, 118, 341/139, 161, 162, 158, 114, 120, 156

(56) References Cited

U.S. PATENT DOCUMENTS 5,172,115 A * 12/1992 Kerth et al. ................. 341/118
5,866,821 A * 2/1999 Raynes ......................... 73/708
5,905,209 A * 5/1999 Oreper ................... 73/862.045
5,942,686 A * 8/1999 Bhardwaj ................. 73/504.16

* cited by examiner

Primary Examiner—Brian Young
Assistant Examiner—John Nguyen
(74) Attorney, Agent, or Firm—Vincent A. Cichosz

(57) ABSTRACT

A device for externally referenced ratiometric signal processing includes an external signal source and a control module. The external signal source has an external voltage reference supply for generating an external reference voltage and a gain & offset circuit for generating a signal voltage. The value of the signal voltage is varies so that the ratio of the signal voltage to the external reference voltage is proportional to the position of a transducer. The control module receives the signal voltage and the external voltage reference. The control module includes an analog to digital converter that converts the signal voltage to a digital signal. The digital signal is proportional to the ratio of the signal voltage to the external reference voltage. A microprocessor may then use the digital signal to infer the position of the transducer.

20 Claims, 1 Drawing Sheet

SYSTEM FOR EXTERNALLY REFERENCED RATIOMETRIC SIGNAL PROCESSING

TECHNICAL FIELD

The present invention relates generally to analog to digital converters and more particularly, to a system for externally referenced ratiometric signal processing.

BACKGROUND ART

Currently, many products use analog to digital converter circuits. The reason for this is that microprocessors analyze and use only digital data. Analog to digital converters are, therefore, necessary to convert electrical analog data to digital data.

As the need to convert analog data to digital data has increased, analog to digital converter circuits have become more sophisticated. Typical analog to digital converter circuits are no longer comprised of individual discrete components, but are instead comprised of integrated circuits and are capable of greater speed, resolution and accuracy.

Analog to digital (A/D) converters change signal voltages into digital numbers by comparing the signal voltages to an AID reference voltage. The resulting digital number represents the ratio of the signal voltage to the AID reference voltage. The A/D reference voltage is usually the supply voltage to the A/D, typically around five volts.

In cases where the incoming signal voltage is not ratiometric to the reference voltage, part to part variability of the A/D supply and reference voltage sources can cause variability in the digital representation of the signal voltage. A traditional method to address the reference voltage supply variability is to supply the reference voltage to the device generating the signal voltage. The device then uses the reference voltage source to compensate the signal voltage for part to part variability of the reference voltage source. Unfortunately, for analog circuits this usually involves using analog multipliers that add cost and complexity to the device and are also subject to temperature drift.

The disadvantages associated with this conventional A/D technique has made it apparent that a new technique for externally referenced ratiometric signal processing is needed. Preferably, the new technique would be able to accurately generate a signal voltage ratiometric to a reference voltage without the need for analog multipliers. The new technique should also not vary with different operating conditions.

SUMMARY OF THE INVENTION

It is, therefore, an object of the invention to provide an improved and reliable means for externally referenced ratiometric signal processing. Another object of the invention is to accurately generate a signal voltage ratiometric to a reference voltage without the need for analog multipliers.

In one aspect of the invention, a device for externally referenced ratiometric signal processing includes an external signal source and a control module. The external signal source has an external voltage reference supply for generating an external reference voltage and a gain & offset circuit for generating a signal voltage. The value of the signal voltage is varied so that the ratio of the signal voltage to the external reference voltage is proportional to the value of a physical phenomenon being measured by a transducer. The control module receives the signal voltage and the external voltage reference. The control module includes an analog to digital converter that converts the signal voltage to a digital signal. The digital signal is proportional to the ratio of the signal voltage to the external reference voltage. A microprocessor may then use the digital signal to determine the position of the transducer.

The present invention thus achieves an improved and reliable means for externally referenced ratiometric signal processing. Also, the present invention is advantageous in that the external voltage reference can be adjusted by the external signal source to communicate diagnostic information to the control module. The external voltage reference may also be adjusted by the control module to communicate information to the external signal source.

Additional advantages and features of the present invention will become apparent from the description that follows, and may be realized by means of the instrumentalities and combinations particularly pointed out in the appended claims, taken in conjunction with the accompanying drawings.

BRIEF DESCRIPTION OF THE DRAWINGS

In order that the invention may be well understood, there will now be described some embodiments thereof, given by way of example, reference being made to the accompanying drawings, in which.

BEST MODE(S) FOR CARRYING OUT THE INVENTION

Figure 1:
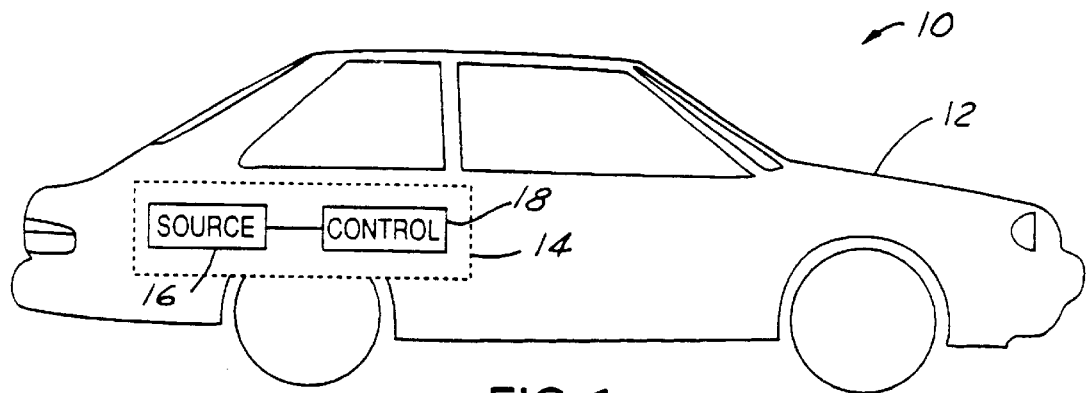
FIG. 1 is a depiction of a vehicle system for externally referenced ratiometric signal processing in accordance with one embodiment of the present invention.

Referring to FIG. 1, a vehicle system for externally referenced ratiometric signal processing in accordance with one embodiment of the present invention is illustrated. Vehicle system 10 includes a vehicle 12 having a device 14 for externally referenced ratiometric signal processing. Device 14 includes an external signal source 16 coupled to a control module 18.

Vehicle system 10 is responsible for insuring proper analog to digital conversion of signal voltages. Analog to digital converters (A/D) change signal voltages into digital numbers by comparing the signal voltages to a reference voltage. The resulting digital number represents the ratio of the signal voltage to the reference voltage. Therefore, the accuracy of the conversion is directly related to the ratio of the signal voltage to the reference voltage. In the prior art, the reference voltage is usually the supply voltage to the A/D, typically around five volts.

Figure 2:
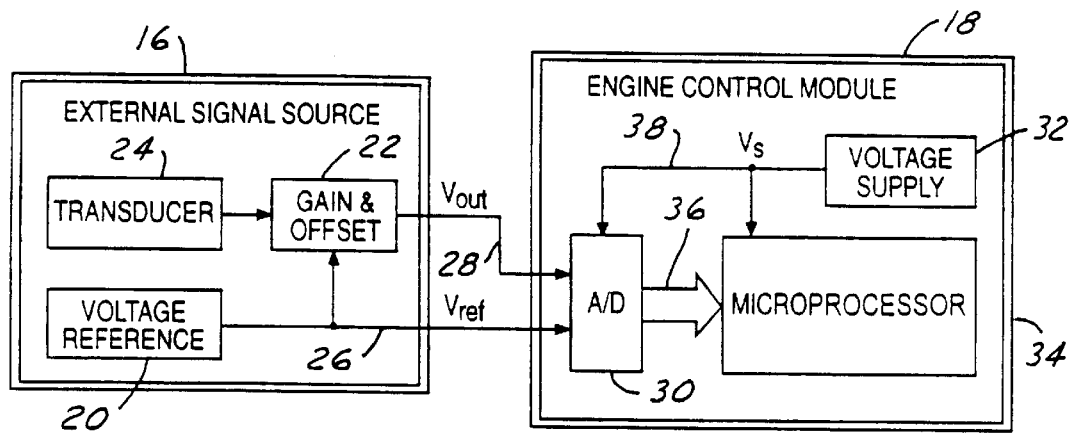
FIG. 2 is a block diagram of a device for externally referenced ratiometric signal processing in accordance with one embodiment of the present invention.

Referring to FIG. 2, a block diagram of a device 14 for externally referenced ratiometric signal processing in accordance with one embodiment of the present invention is illustrated. Device 14 includes an external signal source 16 and a control module 18. In one preferred embodiment of the present invention, control module 18 is an engine control module. One example of an external signal source 16 is an air meter with an analog voltage output signal (the present production air meter generates a frequency that is proportional to airflow rate). The hot wire anemometer technique used for measuring airflow rate generates an absolute voltage signal (i.e.—non-ratiometric). Each air meter is individually calibrated using an adjustable gain and offset to minimize part to part variability. The calibration process could include the calibration of an adjustable voltage reference to be supplied to the engine control module. A humidity sensor is another example of a transducer that generates an absolute voltage signal.

External signal source 16 includes an external voltage reference supply 20, a gain & offset circuit 22, and a transducer 24. Voltage reference supply 20 generates an external reference voltage 26 for external signal source 16. In one preferred embodiment of the present invention, external reference voltage is approximately five volts. Gain & offset circuit 22 generates a signal voltage 28. Gain & offset circuit 22 adjusts signal voltage 28 such that the ratio of signal voltage 28 to external reference voltage 26 is proportional to the value of a physical phenomenon being measured by transducer 24, such as position or air flow rate. For example, assuming that external reference voltage 20 is five volts, when transducer 24 measures the physical phenomenon in a middle position, voltage 28 should be approximately 2.5 volts. Likewise, as the physical phenomenon measured by transducer 24 approaches either extreme, signal voltage 28 will approach approximately zero or five volts. Obviously, gain & offset circuit 22 adjusts signal voltage 22 as external reference voltage 26 varies. External voltage reference supply may also adjust external reference voltage 26 to communicate a state of operation to control module 18.

Control module 18 includes an analog to digital converter 30, a voltage supply 32 and a microprocessor 34. Control module 18 is coupled to external signal source 16 and receives signal voltage 28 and external voltage reference 26. Analog to digital converter 30 converts signal voltage 28 to a digital signal 36. Digital signal 36 is proportional to the ratio of signal voltage 28 to external reference voltage 26. For example, if digital signal 36 is eight bits wide, then it can represent 256 binary numbers. If the ratio of signal voltage 28 to external reference voltage 26 is 0.5, then digital signal 36 will be approximately 128. Microprocessor 34 may then use digital signal 36 to infer the position (middle position) of transducer 24. Control module 18 may also include circuitry associated with analog to digital converter 30 to adjust external reference voltage 26 to communicate information to external signal source 16.

In another aspect of the invention, voltage supply 32 generates an analog to digital reference voltage 38. Control module 18 then determines the voltage difference between external reference voltage 26 and analog to digital reference voltage 38 and compensates signal voltage 28 to produce a compensated signal voltage. Analog to digital converter 20 then generates digital signal 36. In this case, however, digital signal 36 is proportional to the ratio of the compensated signal voltage to analog to digital reference voltage 38.

The present invention provides a low cost method of providing or adding ratiometric capability to device designs that have internal voltage references without the addition of significant complexity or increasing radiated emissions. This invention also enables the ability for the device to report any results of self-diagnostics.

From the foregoing, it can be seen that there has been brought to the art a new and improved system for externally referenced ratiometric signal processing. It is to be understood that the preceding description of the preferred embodiment is merely illustrative of some of the many specific embodiments that represent applications of the principles of the present invention.

Clearly, numerous and other arrangements would be evident to those skilled in the art without departing from the scope of the invention as defined by the following claims:

1. A device for externally referenced ratiometric signal processing, comprising:
   an external signal source having an external voltage reference supply generating an external reference voltage, said external signal source having a gain & offset circuit generating a signal voltage, wherein a ratio of said signal voltage to said external reference voltage is proportional to a value of a physical phenomenon being measured by a transducer; and
   a control module coupled to said external signal source and receiving said signal voltage and said external voltage reference, said control module having an analog to digital converter converting said signal voltage to a digital signal, wherein said digital signal is proportional to said ratio of said signal voltage to said external reference voltage.

2. The device for externally referenced ratiometric signal processing as recited in claim 1, wherein said control module includes a voltage supply generating an analog to digital reference voltage.

3. The device for externally referenced ratiometric signal processing as recited in claim 2, wherein said analog to digital converter determines a voltage difference between said external reference voltage and said analog to digital reference voltage.

4. The device for externally referenced ratiometric signal processing as recited in claim 3, wherein said analog to digital converter uses said voltage difference to compensate said signal voltage to generate a compensated signal voltage.

5. The device for externally referenced ratiometric signal processing as recited in claim 4, wherein said analog to digital converter converts said compensated signal voltage into said digital signal, wherein said digital signal is proportional to the ratio of said compensated signal voltage to said analog to digital reference voltage.

6. The device for externally referenced ratiometric signal processing as recited in claim 1, wherein said control module includes a microprocessor coupled to said analog to digital converter, said microprocessor receiving said digital signal.

7. The device for externally referenced ratiometric signal processing as recited in claim 1, wherein said control module is an engine control module.

8. The device for externally referenced ratiometric signal processing as recited in claim 1, wherein said external voltage reference supply adjusts said external reference voltage to communicate a state of operation to said microprocessor.

9. The device for externally referenced ratiometric signal processing as recited in claim 1, wherein said analog to digital converter includes associated circuitry to adjust said external reference voltage to communicate information to said external signal source.

10. A vehicle system for externally referenced ratiometric signal processing comprising:
    a vehicle having a device for externally referenced ratiometric signal processing, said device comprising;
    an external signal source having an external voltage reference supply generating an external reference voltage, said external signal source having a gain & offset circuit generating a signal voltage, wherein a ratio of said signal voltage to said external reference voltage is proportional to a value of a physical phenomenon being measured by a transducer; and
    a control module coupled to said external signal source and receiving said signal voltage and said external voltage reference, said control module having an analog to digital converter converting said signal voltage to a digital signal, wherein said digital signal is proportional to said ratio of said signal voltage to said external reference voltage.

11. The vehicle system for externally referenced ratiometric signal processing as recited in claim 1, wherein said control module includes a voltage supply generating an analog to digital reference voltage.

12. The vehicle system for externally referenced ratiometric signal processing as recited in claim 2, wherein said analog to digital converter determines a voltage difference between said external reference voltage and said analog to digital reference voltage.

13. The vehicle system for externally referenced ratiometric signal processing as recited in claim 3, wherein said analog to digital converter uses said voltage difference to compensate said signal voltage to generate a compensated signal voltage.

14. The vehicle system for externally referenced ratiometric signal processing as recited in claim 4, wherein said analog to digital converter converts said compensated signal voltage into said digital signal, wherein said digital signal is proportional to the ratio of said compensated signal voltage to said analog to digital reference voltage.

15. The vehicle system for externally referenced ratiometric signal processing as recited in claim 1, wherein said control module includes a microprocessor coupled to said analog to digital converter, said microprocessor receiving said digital signal.

16. The vehicle system for externally referenced ratiometric signal processing as recited in claim 1, wherein said control module is an engine control module.

17. The vehicle system for externally referenced ratiometric signal processing as recited in claim 1, wherein said external voltage reference supply adjusts said external reference voltage to communicate a state of operation to said microprocessor.

18. The vehicle system for externally referenced ratiometric signal processing as recited in claim 1, wherein said analog to digital converter includes associated circuitry to adjust said external reference voltage to communicate information to said external signal source.

19. A method of externally referenced ratiometric signal processing comprising the steps of:

generating an external reference voltage;

generating a signal voltage, wherein a ratio of said signal voltage to said external reference voltage is proportional to a value of a physical phenomenon being measured by a transducer; and generating a digital signal, wherein said digital signal is proportional to said ratio of said signal voltage to said external reference voltage.

20. The method of externally referenced ratiometric signal processing as recited in claim 19, further comprising the steps of:

generating an analog to digital reference voltage;

generating a voltage difference between said external reference voltage and said analog to digital reference voltage;

generating a compensated signal voltage, by applying said voltage difference to said signal voltage; and generating a digital signal, wherein said digital signal is proportional to the ratio of said compensated signal voltage to said analog to digital reference voltage.

\* \* \* \* \*